(12) United States Patent
Scheffler

(10) Patent No.: US 7,961,832 B2
(45) Date of Patent: Jun. 14, 2011

(54) ALL-DIGITAL SYMBOL CLOCK RECOVERY LOOP FOR SYNCHRONOUS COHERENT RECEIVER SYSTEMS

(75) Inventor: Bernd Scheffler, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 1286 days.

(21) Appl. No.: 10/225,837

(22) Filed: Aug. 22, 2002

(65) Prior Publication Data

US 2003/0123571 A1 Jul. 3, 2003

Related U.S. Application Data

(60) Provisional application No. 60/343,967, filed on Dec. 28, 2001.

(51) Int. Cl.
*H03D 3/24* (2006.01)
(52) U.S. Cl. ......... 375/375; 375/371; 375/373; 375/376
(58) Field of Classification Search .................. 375/316, 375/371, 373, 375, 355, 354, 376
See application file for complete search history.

(56) References Cited

U.S. PATENT DOCUMENTS

| 5,646,968 | A  | * | 7/1997 | Kovacs et al. | 375/375 |
| 6,795,514 | B2 | * | 9/2004 | Gresham | 375/354 |
| 6,934,869 | B1 | * | 8/2005 | Bhoja et al. | 713/500 |

OTHER PUBLICATIONS

Data sheet for Philips OQ2541HP; OQ2541U SDH/SONET Data and Clock Recovery Unit, May 27, 1999, 35 pgs.
"U.S. Appl. No. 09/790,861, filed Feb. 23, 2001".

* cited by examiner

*Primary Examiner* — Phuong Phu
(74) *Attorney, Agent, or Firm* — John R. Pessetto; W. James Brady; Frederick J. Telecky, Jr.

(57) ABSTRACT

A symbol clock (16) associated with a symbol stream (5) in a synchronized communication receiver can be recovered by adjusting the phase of a symbol clock signal (12). The phase adjustment is accomplished by applying a digitally controlled delay (13) to the symbol clock signal based on a timing relationship between the symbol clock and symbol transitions (17) in the symbol stream.

14 Claims, 5 Drawing Sheets

ALL-DIGITAL SYMBOL CLOCK RECOVERY LOOP FOR SYNCHRONOUS COHERENT RECEIVER SYSTEMS

This application claims the priority under 35 USC 119(e) (1) of copending U.S. provisional application No. 60/343,967 filed on Dec. 28, 2001 and incorporated herein by reference.

FIELD OF THE INVENTION

This invention relates generally to demodulation in RF receivers and, more particularly, to generation of a symbol clock for use in demodulation.

BACKGROUND OF THE INVENTION

In synchronous coherent RF receiver systems, a symbol clock must be generated for demodulation purposes. One conventional procedure for generating the symbol clock is to convert the IF (intermediate frequency) signal from analog to digital format, and then use digital signal processing algorithms to recover the symbol clock. This approach is typically referred to as software recovery. Another conventional approach is to use a phase locked loop (PLL) with a voltage controlled oscillator (VCO) and an analog loop filter. This latter approach is used in SONET systems.

The aforementioned software recovery approach utilizes digital processing resources on the baseband side, thereby disadvantageously increasing the total digital processing resources required by the receiver system. The aforementioned PLL approach requires additional components to realize the PLL, thereby disadvantageously increasing both the cost of the system and the amount of space (for example printed circuit board area) required.

It is therefore desirable to provide a symbol clock for demodulation in synchronous coherent RF receiver systems without the aforementioned disadvantages of conventional approaches.

According to the invention, a symbol clock associated with a symbol stream can be recovered by phase-adjusting a symbol clock signal to produce the symbol clock. The phase adjustment is accomplished by applying a digitally controlled delay to the symbol clock signal based on a timing relationship between the symbol clock and symbol transitions in the symbol stream.

BRIEF DESCRIPTION OF THE DRAWINGS

FIG. 1 diagrammatically illustrates exemplary embodiments of a digital symbol clock recovery apparatus according to the invention.

FIG. 2 diagrammatically illustrates a demodulator portion of the demodulator apparatus of FIG. 1.

FIG. 3 diagrammatically illustrates the demodulator portion of FIG. 2 in more detail.

FIG. 4 illustrates exemplary operations which can be performed by the demodulator portion illustrated in FIGS. 2 and 3.

FIG. 5 diagrammatically illustrates exemplary embodiments of a transition detection portion of the demodulator apparatus of FIG. 1.

FIG. 6 diagrammatically illustrates exemplary embodiments of the loop filter of FIG. 1.

FIG. 7 is a timing diagram which illustrates exemplary operations of the symbol clock recovery apparatus of FIGS. 1-6.

FIG. 8 illustrates exemplary operations which can be performed by the symbol clock recovery apparatus of FIGS. 1-6.

FIG. 9 diagrammatically illustrates an exemplary digital delay line which can be used according to the invention.

FIG. 10 illustrates exemplary operations that can be performed by an accumulator such as shown in FIG. 9.

DETAILED DESCRIPTION

FIG. 1 diagrammatically illustrates exemplary embodiments of a digital symbol clock recovery apparatus for use in a synchronous coherent RF receiver system according to the invention. The apparatus of FIG. 1 includes a digital FSK demodulator apparatus 15 which demodulates an incoming IF signal 5 to produce therefrom a data stream 6. The demodulator apparatus 15 also produces a symbol transition detection signal 17 which is driven active upon detection of a symbol transition (symbol change) in the data stream. The demodulator apparatus 15 includes an input for receiving a high frequency sampling clock 11 and a further input for receiving a symbol clock 16 which is a delayed version of an original symbol clock 12. The original symbol clock 12 can be produced, for example, by suitably dividing down a crystal oscillator output. A digitally controlled digital delay line 13 is operable for adjusting the phase of the symbol clock 12 to produce the symbol clock 16 for use by the demodulator apparatus 15.

A transition timer 14 has an input for receiving the symbol transition detection signal 17 from the demodulator apparatus 15. The transition timer 14 has a further input for receiving the high frequency sampling clock 11. In response to its inputs, the transition timer 14 produces at 10 and 19 output signals which are input to an Alexander Phase Detector (A-Phi) 18. The signal 10 is an enable signal which enables the Alexander Phase Detector 18 for a predetermined amount of time (for example one symbol time) after each indication of a symbol transition by signal 17. The signal 19 is also driven active for a predetermined amount of time after each symbol transition indication by the signal 17. The predetermined amount of time during which signal 19 is active after each symbol transition indication is, in some embodiments, equal to the duty cycle of the symbol clock 12 (and 16). The time periods during which the signals 10 and 19 are to be active can be readily measured by transition timer 14 based on the sampling clock 11. Each symbol transition indicated at 17 should (ideally) timewise correspond with an edge (e.g. a rising edge) of the symbol clock at 16. Thus, for example, by driving signal 19 active for a period of time equal to the duty cycle of the symbol clock 16, the falling edge of the signal 19 should ideally correspond in time with the falling edge of the symbol clock 16.

The Alexander Phase Detector 18, when enabled by the signal 10, is operable to compare the phase of the symbol clock 16 with the phase of the signal 19, thereby providing an indication of how much the symbol clock 16 is out of phase with the data stream. The Alexander Phase Detector 18, as is well known in the art, activates an up signal if the falling edge of the signal 19 occurs after the falling edge of the symbol clock 16, and activates a down signal if the falling edge of the signal 19 occurs before the falling edge of the symbol clock 16. The up and down signals produced by the Alexander Phase Detector 18 are applied to a low pass digital loop filter 7 which produces a filtered digital signal 8 for input to the delay line 13. The signal 8 is indicative of both the phase difference between the signal 19 and the symbol clock 16, and whether the falling edge of the signal 19 occurred before or after the falling edge of the symbol clock 16. In response to the signal 8, the delay line 13 adjusts an amount of delay applied to the input symbol clock 12, thereby producing at 16 a symbol clock which is adjusted to compensate for the phase difference detected by the Alexander Phase Detector 18.

Figure 1:
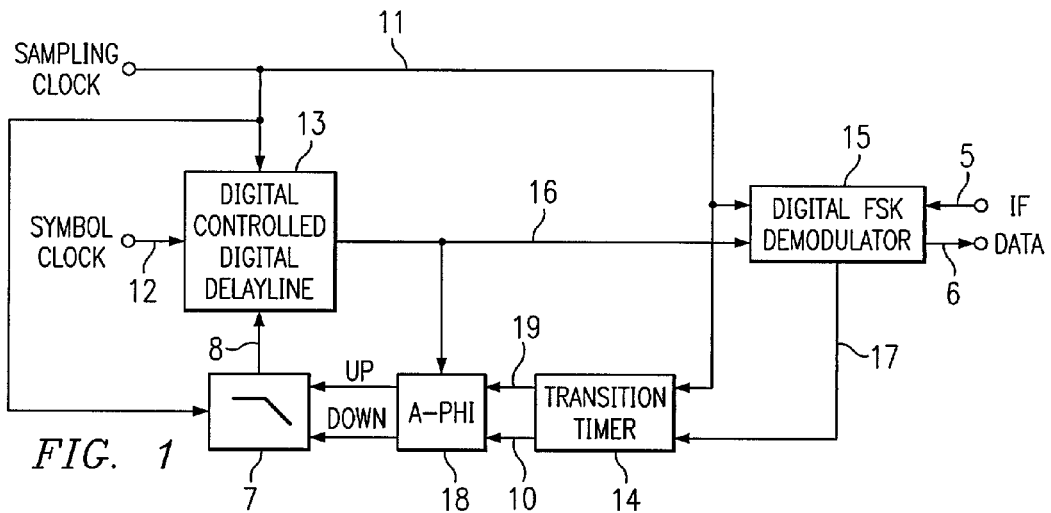
Figure 7:
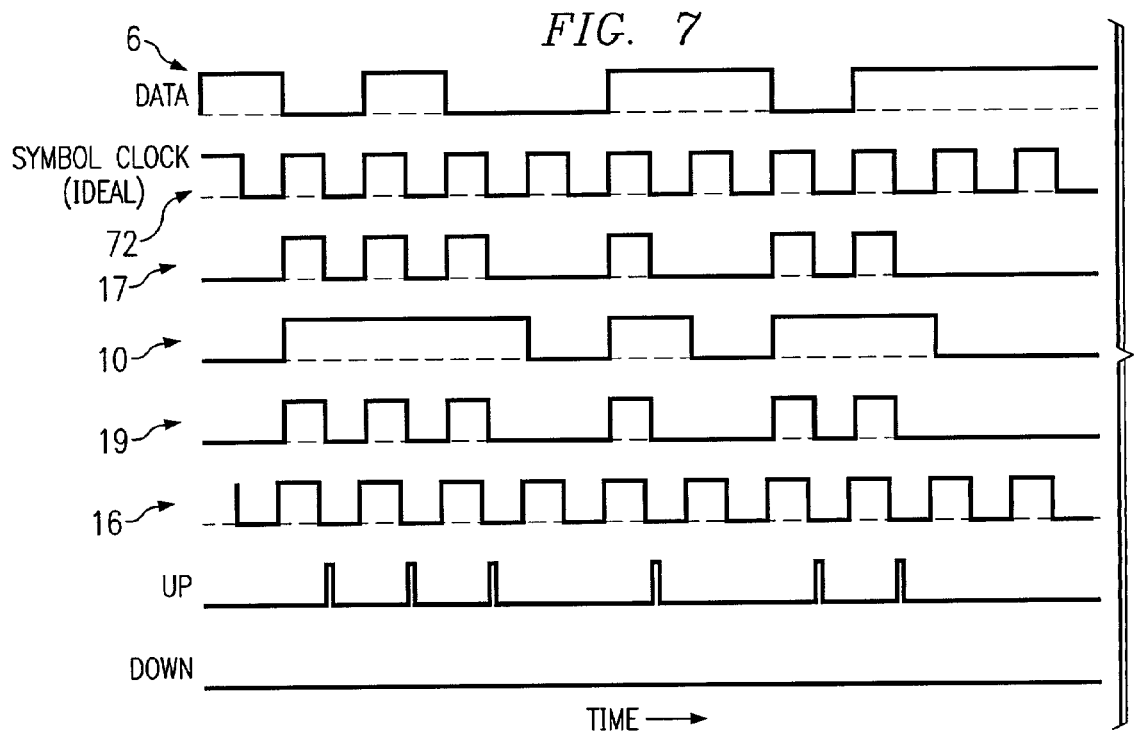

An example of the above-described operation of the apparatus of FIG. 1 is illustrated in FIG. 7. An ideal symbol clock is illustrated at 72, and the remaining signals in FIG. 7 are identified by their corresponding reference characters from FIG. 1. In the FIG. 7 example, the falling edge of signal 19 trails the falling edge of the symbol clock 16, so the up signal is activated.

Figure 2:
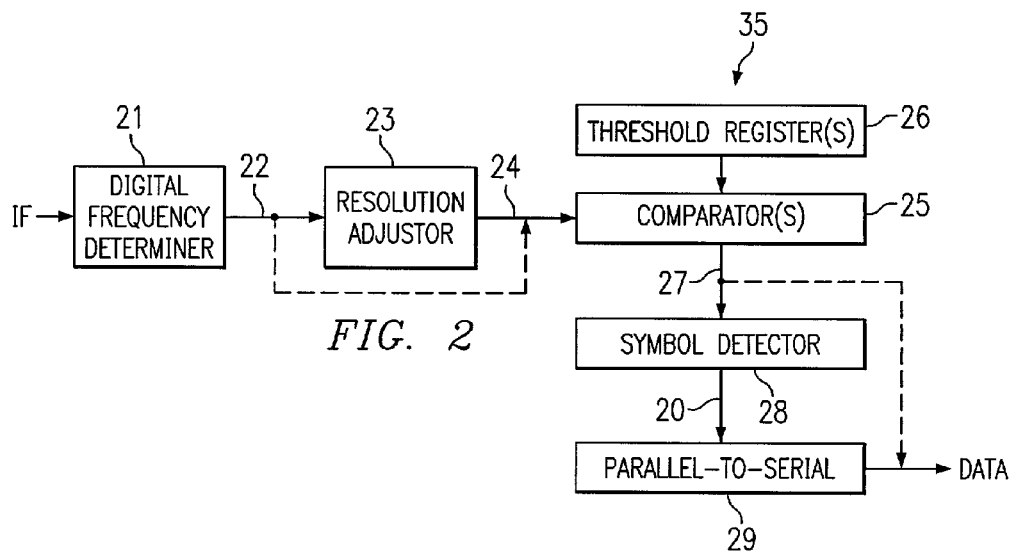

FIG. 2 diagrammatically illustrates pertinent portions of exemplary embodiments of an FSK demodulator portion of the demodulator apparatus 15. The aforementioned IF signal 5, which has been converted into a square wave according to conventional practice, is applied to a digital frequency determiner 21. The digital frequency determiner 21 utilizes digital techniques to provide at output 22 digital information indicative of the frequency of the input IF signal. As shown by broken line in FIG. 2, this digital information at 22 can be applied at 24 directly to a digital symbol determiner 35 for determining symbols represented by the frequencies of the IF signal. The symbol determiner 35 includes one or more digital comparators 25 for respectively comparing the digital information at 24 to one or more threshold values stored in one or more threshold registers 26. The number of comparators and corresponding threshold values is dictated by the desired data rate. For example, and as will be discussed in more detail below, a data rate of one bit/symbol (normal FSK) requires on comparator and one threshold value, whereas a data rate of two bits/symbol (corresponding to 4FSK) requires three comparators and three corresponding threshold values.

For a one bit/symbol data rate (normal FSK), the comparator output 27 is the output data bit, as shown by broken line in FIG. 2. For higher data rates such as two bits/symbol, the respective outputs 27 of multiple comparators at 25 are applied to a symbol detector 28 which decodes the outputs to produce the data bits in parallel format at 20. The parallel formatted data bits are input to a parallel-to-serial converter 29 which provides the data bits in serial format.

In other embodiments, a resolution adjuster 23 can be coupled between the output 22 of the digital frequency determiner 21 and the input(s) 24 of the comparator(s) 25 of the symbol determiner 35. This resolution adjuster 23 can process over time the digital information produced at 22 in order to provide at 24 digital information which represents the IF frequency with more resolution than does the digital information at 22.

Figure 3:
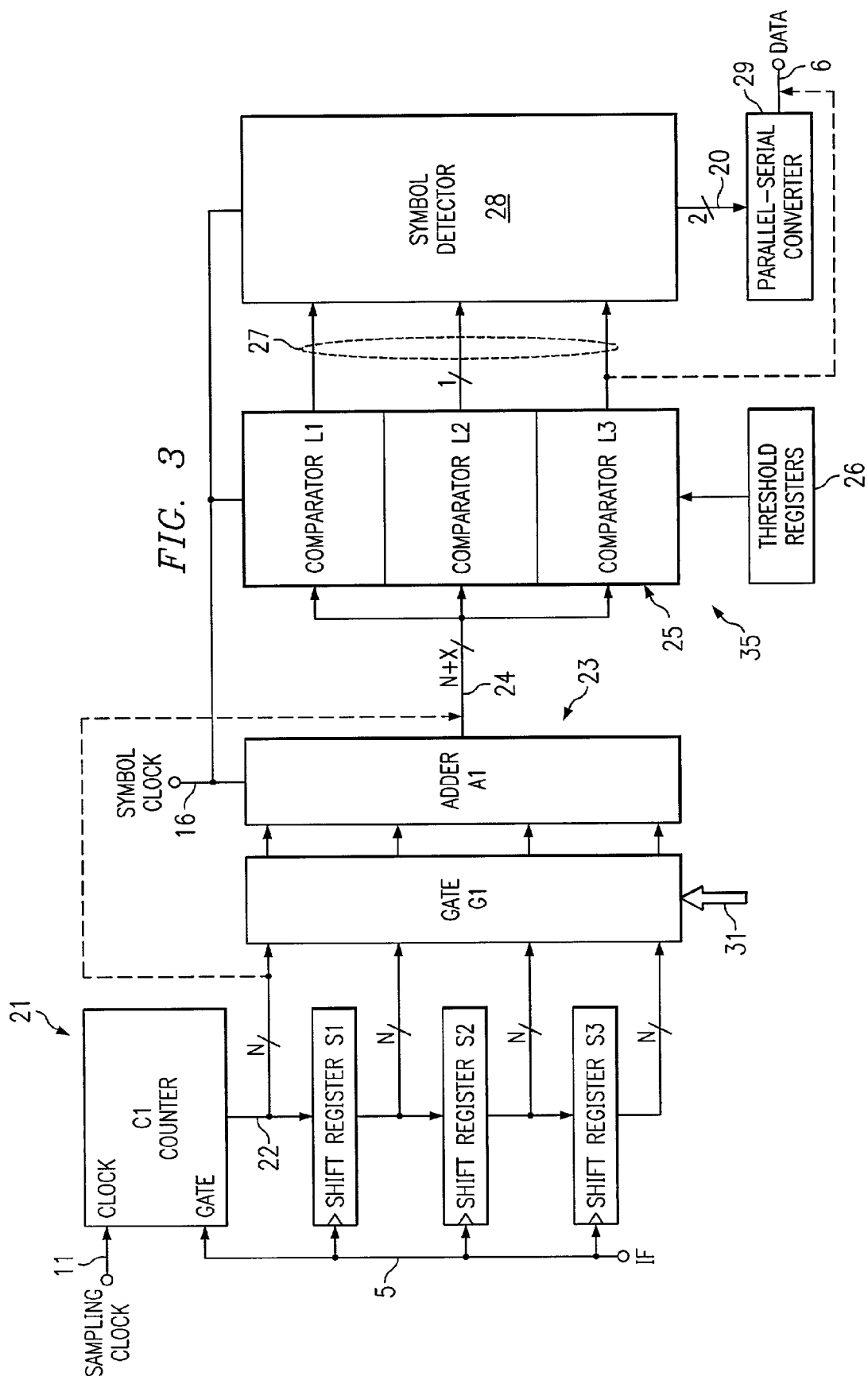

FIG. 3 diagrammatically illustrates the embodiments of FIG. 2 in further detail, including exemplary embodiments of the digital frequency determiner 21 and the resolution adjuster 23 of FIG. 2. In FIG. 3, the digital frequency determiner 21 is embodied as a gated counter C1 having a clock (i.e., count) input for receiving a high frequency sampling clock and having a gate input for receiving the square wave IF signal. Also in FIG. 3, the resolution adjuster 23 includes a plurality of latches S1, S2 and S3 connected in series to provide a shift register. The outputs of the respective latches are coupled to the input of a gating circuit G1 which also receives the output 22 from the gated counter C1. The resolution adjuster 23 of FIG. 3 also includes an added A1 coupled to the outputs of the gating circuit inputs which are passed to the gating circuit outputs in response to a selection control signal 31. The gating circuit can be, for example, any suitable parallel switching arrangement. The sum produced by the adder A1 can be provided to one or more comparators L1-L3 at 25.

Referring to the gated counter C1, when a rising edge appears at the gate input thereof, the current counter content (N bits total) is output at 22, and the previous counter content is simultaneously latched from output 22 into register S1. At the same time, the previous contents of the registers S1 and S2 are latches respectively into registers S2 and S3. Also at the time of a rising edge at the gate input of counter C1, the counter content is reset to 0, and the counter C1 begins again to count sampling clock cycles until the next IF rising edge appears at the gate input thereof.

The shift register arrangement at S1-S3 stores counter values from previous IF cycles, and selected ones of these counter values can be switched via gating circuit G1 and correspondingly accumulated by adder A1. The gate G1 can select any two or more of its inputs to be passed to the adder A1 for the summing operation. In this manner, a multiple number of IF cycles may be used to decide whether a logic 0 or a logic 1 was sent. This summing of current and previous count values advantageously increases resolution yet requires only a small portion of the demodulator to run at high frequency, namely the counter C1.

In the exemplary arrangement of FIG. 3, the adder A1 can add together as many as four counter values. The output 24 of adder A1 thus has N+X bits and, for the illustrated total of four available counter values, X=2. The value of X will of course increase as the size of the shift register arrangement (and thus the number of count values available for summing) increases.

In frequency shift keying, the possible deviations from a nominal IF frequency (2 IF frequency deviations for FSK, 4 IF frequency deviations for 4FSK, etc.) are known and, because the frequency of the sampling clock is known, the expected count value between consecutive rising edges of the IF square wave can be determined in advance. The threshold values within the threshold registers 26 can then be defined accordingly for use by the comparator section 25.

In FSK embodiments, there are two possible IF frequency deviations (e.g., the nominal IF frequency + or − a deviation amount), each of which has a corresponding expected count value which can be easily calculated in advance. The threshold value can then be set, for example, midway between the two expected count (or sum of count) values. Then, if the count value (or sum of count values) at 24 is determined by the comparator to be greater than the threshold value, this indicates a logic 1. Conversely, if the count value (or sum of values) at 24 is determined by the comparator to be less than the threshold value, this indicates a logic 0.

In 4FSK embodiments (with 2 bits/symbol), there are four possible IF frequency deviations (e.g., the nominal IF frequency + or − a deviation amount, and the nominal IF frequency + or − twice the deviation amount), so three comparators L1, L2 and L3 are necessary. Because each of the four possible IF frequency deviations has a corresponding expected count (or count sum) value, three threshold values can be set, for example, midway between the three adjacent pairs of the four expected count (or count sum) values. The comparators at 25 then compare the count (or count sum) value at 24 with the three threshold values to determine which of the four possible IF frequency deviations is represented by the digital value at 24. The results of the three comparisons are provided to the symbol detector 28, which decodes the comparator outputs to produce in parallel format the two bits of the symbol corresponding to the detected IF frequency deviation. These two bits are applied to the parallel-to-serial converter 29 as discussed above.

The above-described broken line embodiments of FIG. 2 are also illustrated by broken line in FIG. 3. Only one comparator (e.g. L3) and one threshold value (and register) are needed in normal FSK embodiments. If multiple comparators are provided (as in FIG. 3), together with multiple threshold registers and symbol detector 28 and parallel-to-serial converter 29, then both FSK and 4FSK operation can be readily supported.

The operations of the adder A1, the comparators at 25 and the symbol detector 28 are suitably synchronized by the adjusted symbol clock 16.

Figure 4:
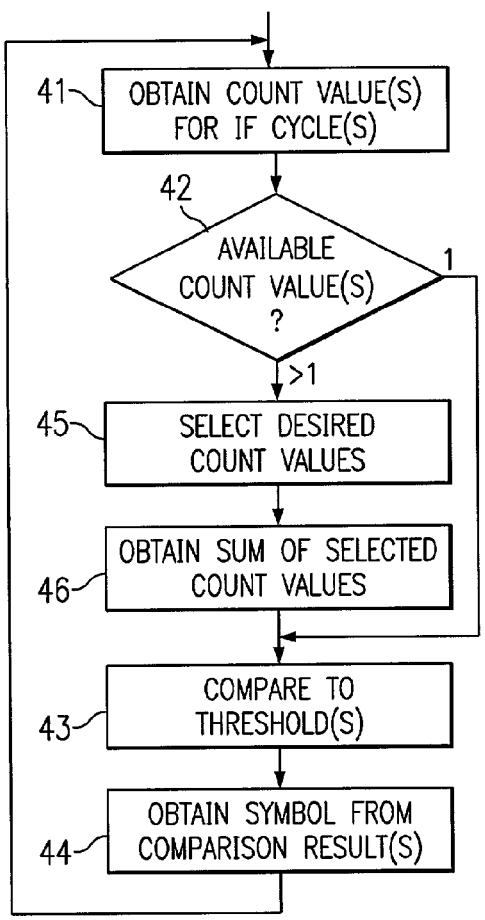

FIG. 4 illustrates exemplary operations which can be performed by the FSK demodulator embodiments of FIGS. 2 and 3. After obtaining at 41 the count value(s) for the IF cycle(s), the number of available count values is determined at 42. If there is only one available count value, then this count value is compared at 43 to a threshold value (for FSK) or a plurality of threshold values (e.g., for 4FSK). Thereafter at 44, the symbol is obtained from the result(s) of the comparison(s) at 43. After the symbol has been obtained at 44, the next count value(s) can be awaited at 41.

If there is more than one available count value at 42, then the desired count values are selected at 45, and the sum of the selected count values is obtained at 46. Thereafter at 43, the count value sum is compared to one or more threshold values. At 44, a symbol is obtained from the result(s) of the comparison(s) at 43.

Figure 5:
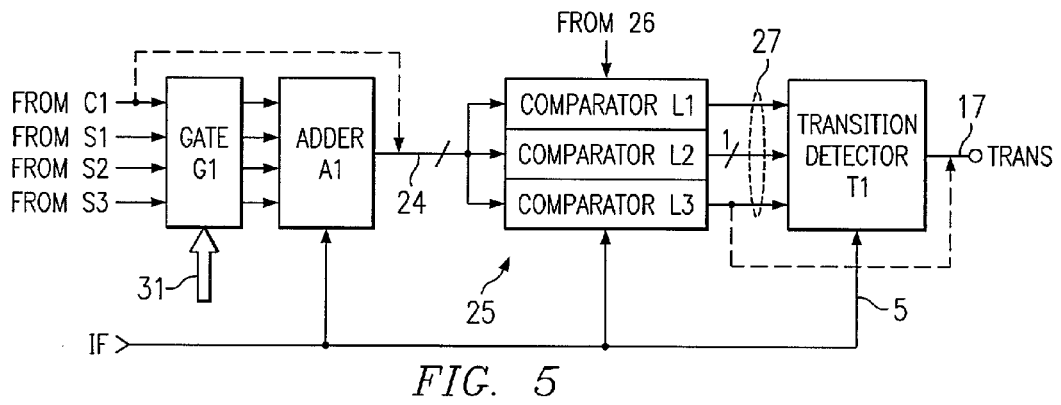

FIG. 5 diagrammatically illustrates exemplary embodiments of a transition detection portion of the demodulator apparatus 15 of FIG. 1. This portion of the apparatus 15 produces the detection signal 17. As shown in FIG. 5, the transition detection portion has generally the same structure as the FSK demodulator portion shown in FIG. 3, except the IF square wave signal is used instead of the symbol clock for synchronization because symbol transitions, not symbols themselves, are being detected. Also, the symbol detector 28 of FIG. 3 is replaced by a transition detector T1 in FIG. 5. When the transition detector T1 detects a change in the state of the comparator outputs at 27, the transition detector T1 activates its output 17 to indicate that a symbol transition (i.e., a symbol change) has occurred. Of course, in normal FSK embodiments, the output of a single comparator (e.g. L3) directly provides the indication of a symbol transition at 17. The transition detection portion of FIG. 5 can, in some embodiments, operate generally in the manner illustrated in FIG. 4, except a symbol transition is detected (or not) at 44 based on the comparison result(s).

Figure 6:
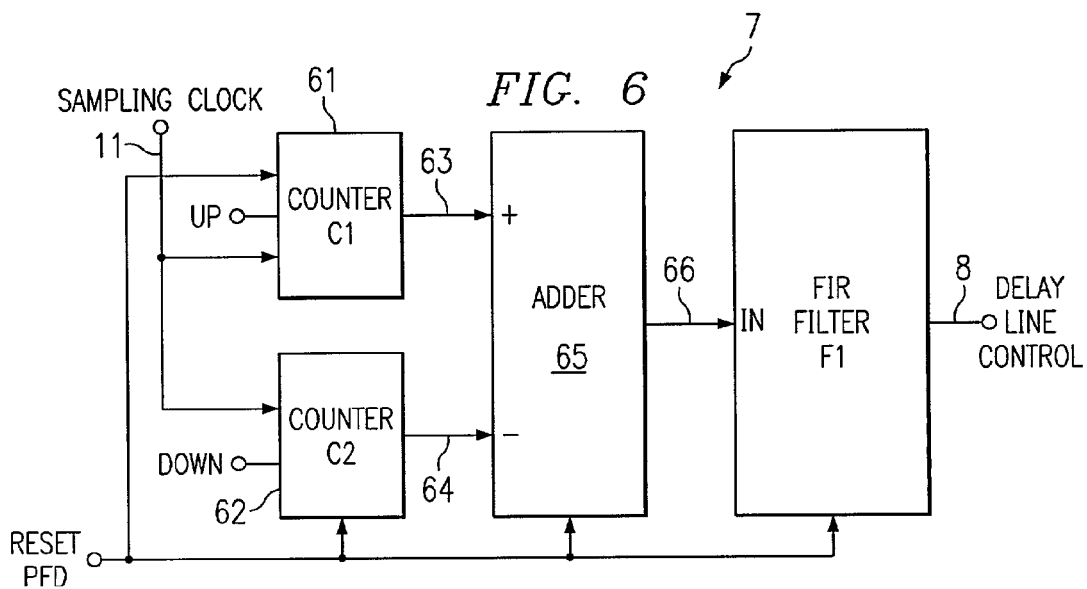

FIG. 6 diagrammatically illustrates exemplary embodiments of the low pass loop filter 7 of FIG. 1. As shown in FIG. 6, the filter includes counters 61 and 62 which are respectively enabled by the up and down signals provided by the Alexander Phase Detector 18 of FIG. 1. While enabled, each counter counts pulses of the high frequency sampling clock 11. The count output 63 of counter 61 is applied to the "+" input of an adder A1, and the count output 64 of counter 62 is applied to the "−" input of the adder A1. The adder A1 outputs at 66 an accumulated count value which is increased by operation of the counter 61 and decreased by operation of the counter 62. The accumulated count value at 66 is input to an FIR (Finite Impulse Response) filter F1. The filtered, accumulated count value output by filter F1 is the signal 8 which controls operation of the delay line 13 of FIG. 1. In some embodiments, the filter F1 implements a low pass filter function with a cut-off point lower than the delay inserted by the Alexander Phase Detector 18 (see also FIG. 1).

In some embodiments, the digital delay line 13 of FIG. 1 includes a counter coupled to be loaded with the filtered count value 8 produced by the filter F1. The counter is decremented with each cycle of the sampling clock, thereby implementing the desired delay time of the delay line 13. The symbol clock delay implemented by the delay line 13 is completed when the counter reaches zero. Thus, the filtered, accumulated count value at 8 controls the amount of time delay implemented by the delay line 13. After each clock cycle of original symbol clock 12, the counter is loaded with the current value at 8.

Figure 9:
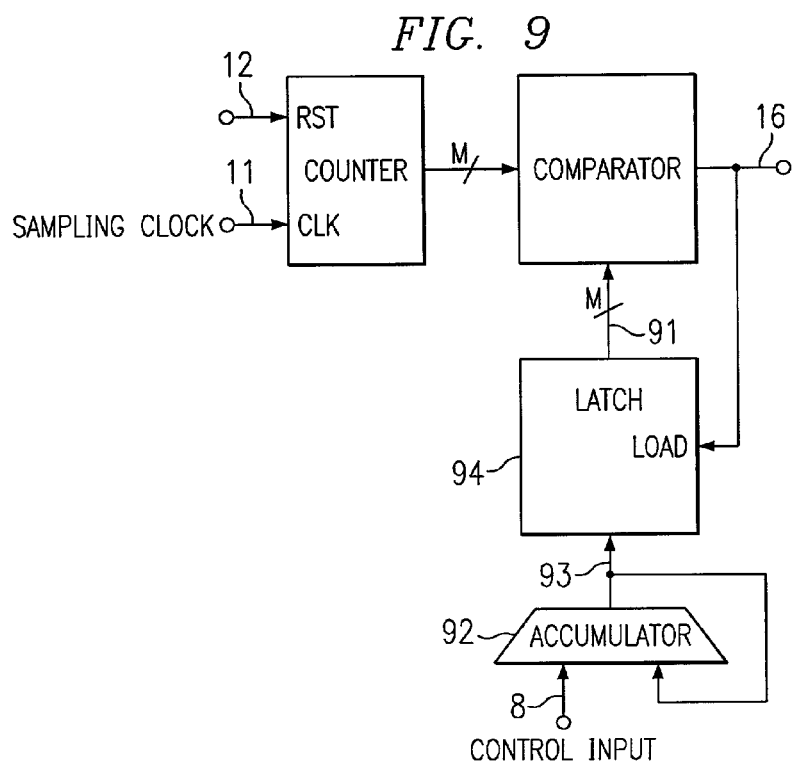
Figure 10:
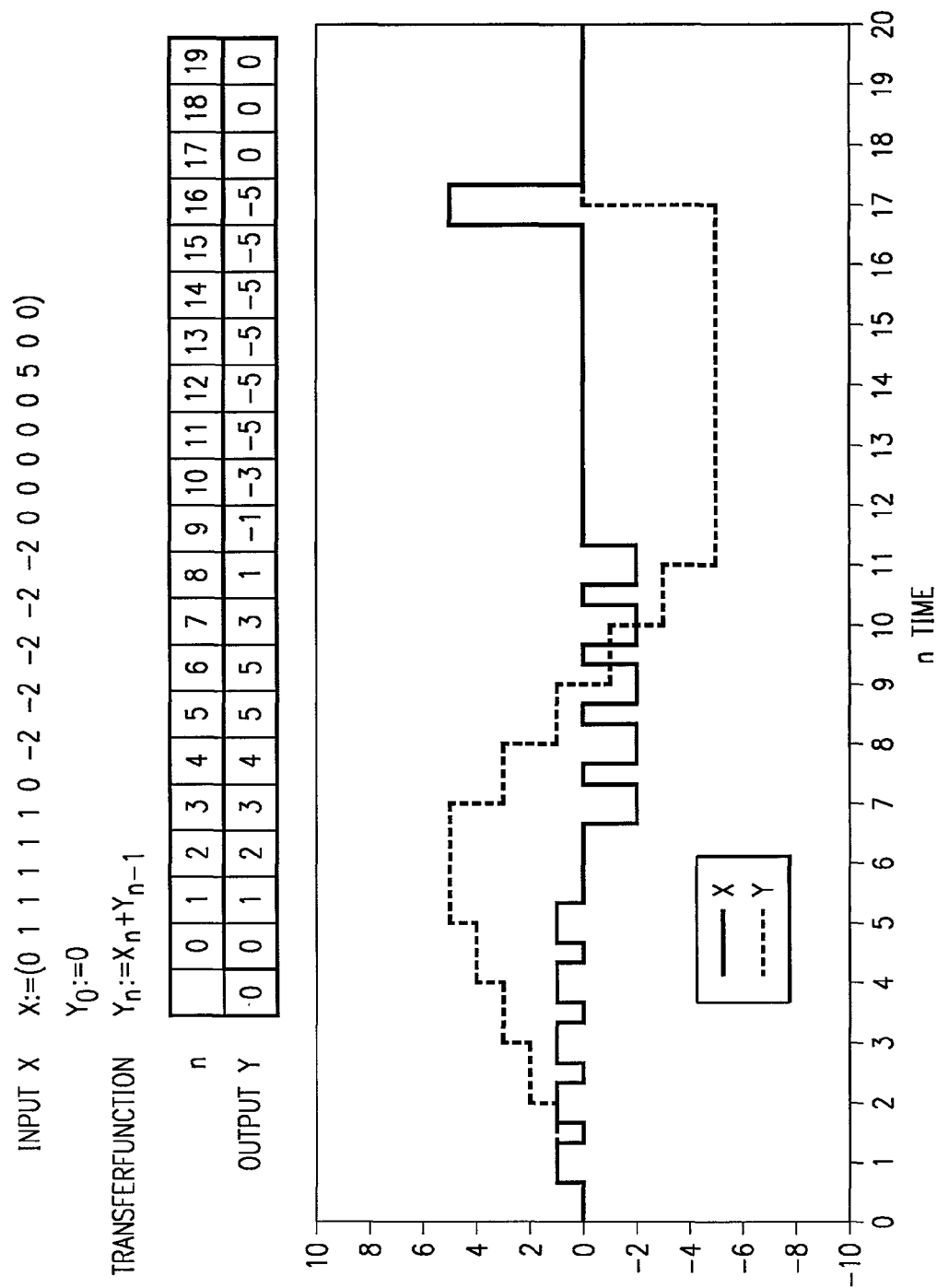

An exemplary digital delay line implementation is shown in FIG. 9, wherein the output of a counter is compared to a digital threshold value 91 that is based on the accumulated count value 8. The accumulator 92 acts as a digital integrator, accumulating the count value 8 (i.e., phase error). This permits realization of a loop of $1^{st}$ order, ensuring the occurrence of static control offset. FIG. 10 illustrates exemplary operations of an accumulator such as accumulator 92 of FIG. 9. In FIG. 10, X and Y generally correspond to the input control signal 8 and the output signal 93, respectively, of FIG. 9. When the counter reaches the current threshold value, the comparator output (i.e., the symbol clock 16) loads the next threshold value into latch 94.

Figure 8:
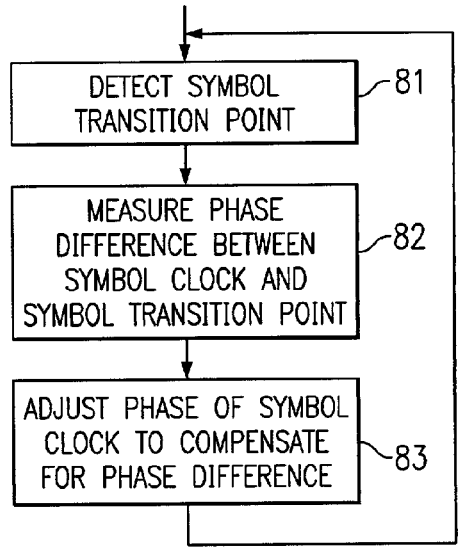

FIG. 8 illustrates exemplary operations which can be performed by the embodiments of FIGS. 1-6. At 81, a symbol transition point is detected. At 82, the phase difference between the symbol clock and the symbol transition point is measured. At 83, the phase of the symbol clock is adjusted to compensate for the phase difference measured at 82. It will be evident to workers in the art that the digital symbol clock recovery apparatus embodiments described above can be implemented using suitable digital signal processing circuitry, including software, hardware or a combination of software and hardware.

Although exemplary embodiments of the invention are described above in detail, this does not limit the scope of the invention, which can be practiced in a variety of embodiments.

What is claimed is:

1. An apparatus for recovering a symbol clock associated with a symbol stream in a communication receiver, comprising:

a digital delay line having an input for receiving a symbol clock signal, said digital delay line having an output for providing the symbol clock;

a digital control circuit coupled to said digital delay line for providing thereto a digital control signal, said digital delay line for phase-adjusting said symbol clock signal based on said digital control signal to produce said symbol clock, said digital control signal indicative of a timing relationship between said symbol clock and symbol transitions in said symbol stream;

wherein said digital control circuit includes a digital transition detection circuit having an input for receiving said symbol stream, said digital transition detection circuit responsive to said symbol stream for outputting a transition detection signal indicative of symbol transitions in said symbol stream;

wherein said digital control circuit includes a digital phase detection circuit coupled to said digital transition detection circuit for receiving said transition detection signal, said digital phase detection circuit having an input for receiving said symbol clock, said digital phase detection circuit operable for determining a phase difference between said symbol clock and said transition detection signal, said digital phase detection circuit having an output coupled to said digital delay line input for providing said control signal to said digital delay line, said control signal indicative of said phase difference between said symbol clock and said transition detection signal; and wherein said digital phase detection circuit includes a transition timer coupled to said transition detector and responsive to said transition detection signal for producing a compare signal, said compare signal active for a predetermined period of time after each symbol transition indication of said transition detection signal.

2. The apparatus of claim 1, wherein said digital phase detection circuit includes an Alexander phase detector coupled to said transition timer for receiving said compare signal, said Alexander phase detector coupled to said phase detection circuit input for receiving said symbol clock, said Alexander phase detector operable for comparing said symbol clock to said compare signal and producing a phase difference signal indicative of a phase difference between said compare signal and said symbol clock.

3. The apparatus of claim 2, wherein said digital phase detection circuit includes a digital loop filter apparatus coupled to said output of said digital phase detection circuit and also coupled to said Alexander phase detector for receiving and filtering said phase difference signal thereby to produce said control signal at said output of said digital phase detection circuit.

4. The apparatus of claim 3, wherein said digital loop filter apparatus includes a counter circuit having an input for receiving said phase difference signal, and having an output for providing count information in response to said phase difference signal, said digital loop filter apparatus further including an arithmetic circuit coupled to said counter output for performing an arithmetic operation on said count information to produce arithmetic information, said digital loop filter apparatus including a digital filter coupled to said arithmetic circuit for receiving and filtering said arithmetic information.

5. The apparatus of claim 4, wherein said phase difference signal includes first and second constituent signals, said counter circuit including first and second counters for respectively receiving said first and second signals, said counter information including first and second count values respectively produced by said first and second counters, said arithmetic circuit including an adder for adding said first and second count values, and said digital filter including a digital FIR filter.

6. The apparatus of claim 1, wherein said predetermined time is a length of a duty cycle of said symbol clock signal.

7. A method of recovering a symbol clock associated with a symbol stream in a communication receiver, comprising:

receiving a symbol clock signal;

receiving said symbol stream and producing in response to said symbol stream a transition detection signal indicative of symbol transitions in said symbol stream;

determining a phase difference between said symbol clock and said transition detection signal, said last-mentioned applying step including producing a control signal indicative of said phase difference between said symbol clock and said transition detection signal;

applying a digitally controlled phase adjustment to said symbol clock signal to produce the symbol clock, including applying the digitally controlled phase adjustment to said symbol clock signal based on a timing relationship between said symbol clock and symbol transitions in said symbol stream; and wherein said step of producing said control signal includes producing in response to said transition detection signal a compare signal which is active for a predetermined period of time after each symbol transition indication of said transition detection signal.

8. The method of claim 7, wherein said step of producing said control signal includes comparing said symbol clock to said compare signal and producing a phase difference signal indicative of a phase difference between said compare signal and said symbol clock.

9. The method of claim 8, wherein said step of producing said control signal includes filtering said phase difference signal to produce said control signal.

10. A communication receiving apparatus, comprising: an input for receiving a symbol stream;

a demodulator coupled to said input for demodulating said symbol stream to extract communication data therefrom, said demodulator having an input for receiving a symbol clock, said demodulator operable for extracting said communication data from said symbol stream based on said symbol clock; and a symbol clock recovery apparatus coupled to said demodulator input for providing thereto said symbol clock, said symbol clock recovery apparatus including a digital delay line having an input for receiving a symbol clock signal and having an output coupled to said demodulator input for providing said symbol clock, said symbol clock recovery apparatus including a digital control circuit comprising a loop filter coupling a phase detector to said digital delay line for providing thereto a digital control signal, said digital delay line for phase-adjusting said symbol clock signal based on said digital control signal to produce said symbol clock, said digital control signal indicative of a timing relationship between said symbol clock and symbol transitions in said symbol stream.

11. The apparatus of claim 10, wherein said loop filter is a low pass digital loop filter.

12. The apparatus of claim 10, wherein said phase detector is an Alexander phase detector.

13. The apparatus of claim 10, wherein said phase detector couples a transition timer to said loop filter.

14. An apparatus for recovering a symbol clock associated with a symbol stream in a communication receiver, comprising:

a digital delay line having an input for receiving a symbol clock signal, said digital delay line having an output for providing the symbol clock; and a digital control circuit comprising a loop filter coupling a phase detector to said digital delay line for providing thereto a digital control signal, said digital delay line for phase-adiustinq said symbol clock signal based on said digital control signal to produce said symbol clock, said digital control signal indicative of a timing relationship between said symbol clock and symbol transitions in said symbol stream;

wherein said phase detector couples a transition timer to said loop filter.

* * * * *